(12) United States Patent
Van Bommel et al.

(10) Patent No.: US 8,432,500 B2
(45) Date of Patent: Apr. 30, 2013

(54) LIGHTING DEVICE WITH THERMALLY VARIABLE REFLECTING ELEMENT

(75) Inventors: Ties Van Bommel, Horst (NL); Rifat A. M. Hikmet, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 224 days.

(21) Appl. No.: 13/120,166

(22) PCT Filed: Sep. 16, 2009

(86) PCT No.: PCT/IB2009/054041
§ 371 (c)(1), (2), (4) Date: Mar. 22, 2011

(87) PCT Pub. No.: WO2010/035171
PCT Pub. Date: Apr. 1, 2010

(65) Prior Publication Data
US 2011/0176076 A1 Jul. 21, 2011

(30) Foreign Application Priority Data

Sep. 23, 2008 (EP) .................................. 08164912
Oct. 17, 2008 (EP) .................................. 08166870

(51) Int. Cl.
*G02F 1/133* (2006.01)
*G02F 1/01* (2006.01)
*F21V 33/00* (2006.01)
*F21V 3/00* (2006.01)

(52) U.S. Cl.
USPC .......... 349/22; 359/288; 362/93; 362/311.02; 362/311.03

(58) Field of Classification Search ............... 349/22; 359/288; 362/93, 311.02, 311.03
See application file for complete search history.

(56) References Cited

U.S. PATENT DOCUMENTS

| 3,648,280 A | 3/1972 | Jacobs |
| 4,169,661 A | 10/1979 | Yamada et al. |

(Continued)

FOREIGN PATENT DOCUMENTS

| JP | 2001811 A | 8/1990 |
| WO | 2006097868 A2 | 9/2006 |

(Continued)

OTHER PUBLICATIONS

Narendran, "Improved performance white LED", 5th International Conference on Solid State Lighting, Proceedings of SPIE 5941, 45-50, Bellingham,WA, International Society of Optical Engineers.

*Primary Examiner* — Mike Qi
(74) *Attorney, Agent, or Firm* — Mark L. Beloborodov (57) ABSTRACT

The invention provides a lighting device (100) comprising a light source (10) arranged to generate light source light (11), an optional luminescent material and a thermally variable reflecting element (60). The optional luminescent material (205) is arranged downstream of the light source (10) and is arranged to convert at least part of the light source light (11) into luminescent material light (211). One or more of the light source (10) and the optional luminescent material (205) generate heat when the light source (10) generates light source light (11). The thermally variable reflecting element (60) is arranged downstream of the light source (10) and the optional luminescent material (205). The thermally variable reflecting element (60) has a first state wherein it is substantially reflecting and a second state wherein it is substantially transparent; heat induces a chance from the first state to the second state. The thermally variable reflecting element (60) is arranged to transmit at least part of one or more selected from the group consisting of the light source light (11) and optional luminescent material light (211) when being in the second state. The lighting device (100) is arranged to transport heat generated by one or more of the light source (10) and the optional luminescent material (205) to the thermally variable reflecting element (60).

13 Claims, 4 Drawing Sheets

U.S. PATENT DOCUMENTS

| | | |
|---|---|---|
| 4,731,417 A | 3/1988 | Miyata et al. |
| 4,900,135 A | 2/1990 | Yuasa et al. |
| 5,083,251 A | 1/1992 | Parker |
| 5,977,201 A | 11/1999 | Jahns et al. |
| 6,056,421 A | 5/2000 | Johnson |
| 6,362,303 B1 | 3/2002 | Byker et al. |
| 6,526,078 B2 | 2/2003 | Lee |
| 8,008,845 B2 * | 8/2011 | Van De Ven et al. ........... 313/46 |
| 2005/0269582 A1 | 12/2005 | Mueller et al. |
| 2006/0202105 A1 | 9/2006 | Krames et al. |
| 2007/0126017 A1 | 6/2007 | Krames et al. |
| 2010/0290208 A1 * | 11/2010 | Pickard ........................... 362/84 |
| 2012/0261680 A1 * | 10/2012 | Demuynck ..................... 257/88 |

FOREIGN PATENT DOCUMENTS

| | | |
|---|---|---|
| WO | 2006114726 A2 | 11/2006 |
| WO | 2007007235 A2 | 1/2007 |
| WO | 2007046035 A1 | 4/2007 |
| WO | 2007080555 A1 | 7/2007 |
| WO | 2007007220 A1 | 1/2008 |

* cited by examiner

LIGHTING DEVICE WITH THERMALLY VARIABLE REFLECTING ELEMENT

FIELD OF THE INVENTION

The invention relates to a lighting device comprising a light source, especially a LED, and a variable reflecting element. The invention further relates to the use of a thermally variable reflecting element for use in such lighting devices.

BACKGROUND OF THE INVENTION

Variable reflecting elements are known in the art. U.S. Pat. No. 4,900,135 for instance describes an optical element comprising a pair of plates between which an optical modulation liquid layer is sandwiched, the optical modulation liquid layer exhibiting a light reflecting property caused by suspension of fine particle polymer when not heated and exhibiting transparency caused by dissolution of fine particle polymer when heated, the change of such light reflecting property to transparency being reversible.

Further, WO2007/007220 discloses an illumination device for illuminating an object comprising a light source to emit light, an adjustable optical element for adjusting the light originated from the light source into adjusted light, and a controller for controlling at least one element of a group of elements comprising the adjustable optical element and the light source in response to an adjusting control signal via at least one driving signal. The adjustable optical element comprises at least one element of the following group of optical elements comprising a liquid crystalline lens, a controllable scattering element, a controllable diffraction, a refraction element and a reflection element.

Further, WO2007007235 discloses a light module with a light source for emitting a beam of light, an adjustable optical element for adjusting the beam of light from the light source into an adjusted beam of light with a scattering pattern that is electrically variable, and a controller for controlling, in response to an adjusting control signal, at least one element of a group of elements comprising the adjustable optical element and the light source by means of at least one driving signal. A multi-purpose light, for example for interior car lighting, is advantageously provided thereby.

SUMMARY OF THE INVENTION

In phosphor LEDs, based on blue LEDs, in general a yellow emitting phosphor is placed on top of a blue LED in order to convert part of the blue light to yellow light. Combination of blue and yellow lights results in white light. However in applications such as flash lights in mobile phones, such LEDs with a yellow phosphor have a yellow appearance which is in general not desired by the customer.

In order to avoid this yellow (more in general: colored) appearance one may place white diffusers on top of the yellow phosphor. Such diffusers however reduce the efficiency of the LED as some of the light is reflected back into the LED where it gets absorbed and lost.

Hence, it is an aspect of the invention to provide an alternative lighting device, which preferably further at least partly obviates one or more of above-described drawbacks.

Here the use of a material to be placed above the light source, especially a LED, which upon heating changes its state from reflecting to transparent, is suggested. The reflection can be diffuse (scattering) or specular. Therefore when combined with the light source such a material in the light source off state is reflecting and has a white appearance. When the light source is switched on, the material becomes spontaneously transparent and light emitted by the light source passes through without substantially back reflecting; thus substantially no light is lost.

In a first aspect, the invention provides a lighting device comprising (a) a light source arranged to generate light (herein denoted as light source light), (b) an optional luminescent material (light converting element) arranged downstream of the light source and arranged to convert at least part of the light source light having a first emission spectrum into light having a second emission spectrum different from the first emission spectrum (herein denoted as luminescent material light) (or optionally arranged to convert at least part of luminescent material light of another luminescent material), wherein one or more of the light source and the optional luminescent material generate heat when the light source generates light source light, and (c) a thermally variable reflecting element, arranged downstream of the light source and the optional luminescent material, having a first state wherein it is substantially reflecting and a second state wherein it is substantially transparent, and wherein heat induces a chance from the first state to the second state, wherein the thermally variable reflecting element is arranged to transmit at least part of one or more selected from the group consisting of the light source light and optional luminescent material light when being in the second state, and wherein the lighting device is arranged to transport heat generated by one or more of the light source and the optional luminescent material to the thermally variable reflecting element. In this way, heat from the light source and/or the luminescent material is used to switch the thermally variable reflective element from the first to the second state.

In an embodiment, the thermally variable reflecting element is arranged the scatter light in the first state (i.e. diffuse scattering). In such embodiment, the thermally variable reflecting element is a thermally variable scattering element. In yet another embodiment, the thermally variable reflecting element is arranged to specularly reflect light (i.e. specular reflection). Hence, in an embodiment, the thermally variable reflecting element is arranged to be specularly reflecting in the first state.

Advantageously, such lighting device may be switchable in a substantially transparent state, for transmitting light source light, and in a substantially not-transparent state (i.e. the reflecting state), thereby impeding that an observer, external from the lighting device, is able to observe the light source and/or the (colored) luminescent material. Switching between the first and the second state can be within seconds after an increase in the temperature. Preferably, the thermally variable reflecting element is able to switch between the states within about 1 second. Even more preferably, the thermally variable reflecting element is able to switch between the states within about 0.1 second. Materials which can show temperature controllable scattering and reflection can be divided into two types of materials.

1) Materials which are crystalline or liquid crystalline and show optical anisotropy.

When in these materials crystallites or liquid crystal domains are randomly oriented they show scattering. Upon melting of crystals or transition of the liquid crystal phase to an isotropic phase scattering disappears. Materials which can be used are small molecules, polymers, copolymers, cross-linked systems. It is also possible to use mixture of liquids or polymers but also dispersed systems.

A special case of these materials are this which show specular reflection. For example in the chiral nematic (cholesteric) liquid crystals phase molecules are arranged so that a band of light is reflected. The width of the reflection band can be adjusted by the optical anisotropy and the pitch of the chiral phase. In this phase usually colored reflections occur as the width of the reflection band is in the order of hundred nanometers. However it is possible to make the reflection band broad by bringing a pitch gradient or stacking various layers on top of each other to get a silver colored appearance. For example, it is possible to combine certain wavelength reflecting materials with phosphors which absorb in a certain wavelength region to make the appearance of the system color neutral. A yellow phosphor absorb blue light. When on top of such a yellow phosphor a blue reflecting thermally variable reflecting element is placed its appearance will become color neutral and reflect white light. In order to reduce angular dependence of such an element a light diffusing element with low back reflection can be used.

It is also possible to produce multilayer's which also show specular reflection. An especial case of a multilayer system is one which contain anisotropic (birefringent) layers. In this case a polarized reflection which can have silver appearance can be produced. Here again above the melting or isotropic transition temperature of the anisotropic layer the reflective appearance disappears.

2) Materials which Show Temperature Dependant Miscibility

Such materials can show temperature controllable scattering. In such systems two or more components are mixed together. At a certain temperature all the components are miscible and a single phase is obtained. In the case of system showing upper critical temperature behavior, below a certain temperature the system separates into two phases and show scattering. In the case of system showing lower critical temperature behavior, above a certain temperature the system separates into two phases and show scattering. In the present application the latter system is appropriate. Such systems are produced using polymer blends, solutions, and salt containing systems.

Herein, the term "thermally variable reflecting element" relates to an element that is able to substantially scatter light depending upon the temperature of the element. At a lower temperature, the element is substantially reflecting and at a higher temperature, the element is substantially not reflecting. Another term for "thermally variable reflecting element" may also be "thermo responsive element".

The thermally variable reflecting element may especially be based on one or more of thermochromic organic compounds, thermochromic inorganic compounds, thermochromic polymeric compounds and thermochromic sol-gel systems. A thermochromic material as a result of a change in temperature shows a change in both the real and imaginary parts of the refractive index. For example if a layered structure comprises a thermochromic material is produced to reflect a band of light, at the thermochromic transition temperature the reflection band position can be altered. In the same way at the thermochromic transition temperature scattering and absorption properties of the material can be altered changing its appearance.

With reference to organic compound thermochromism it is known that the mechanism responsible for thermochromism varies with molecular structure. It may be due to an equilibrium between two molecular species, acid-base, keto-enol, lactim-lactam, or between stereo isomers or between crystal structures. Three principles can be distinguished: variation in crystal structure, stereo isomers and molecular rearrangement. Advantages of thermochromism for these organic compounds are that color change takes place sharply and that there are many factors, known to the person skilled in the art, to control temperature easily.

Thermochromic liquid crystals show different colors at different temperatures because of selective reflection of specific wavelength of light from their structure. In an appropriate temperature range intermediate between a low-temperature crystalline phase and a high-temperature isotropic liquid phase, these materials form cholesteric liquid crystal. In a cholesteric liquid crystal changes in temperature result in thermal expansion, which leads to a change in layer spacing and hence pitch and therefore the color change observed will vary with temperature. These materials are used in the manufacture of thermochromic printing ink. A thermochromic liquid crystal has the advantage that it may express a fine colored image. However the effect shown by cholesteric liquid crystals is based on reflection and not on absorption which is needed for optical recording effect described above.

Thermochromism arising from variations in stereo isomers in mostly associated with 'overcrowded' ethylenes, such as bianthrone, dixanthylene and xanthylidenanthrone. These compounds are characterized by at least one ethylene group, a number of aromatic rings and a hetero-atom, usually nitrogen or oxygen. The ethylene bond places a restriction on the molecular orientations possible, thereby increasing the energy barrier between different stereo isomeric configurations. As the temperature is increased, the molecule 'switches' between different stereo isomers, this change being accompanied by a variation in color. The majority of compounds that exhibit this behavior show in excess of 150° C. (for example bianthrone is colorless when solid, but forms green droplets above its melting point).

The molecular rearrangement of an organic compound that arises from tautomerization, such as that which occurs as a result of, for example, an acid-base, keto-enol or lactim-lactam equilibrium, can lead to an increase in the conjugation of the molecule and formation of a new chromophore. Such molecular rearrangement can be effected by amongst others a change in temperature.

With reference to inorganic thermochromism, it is found that many metals and inorganic compounds exhibit thermochromic behavior either as solids or in solution. It has been suggested that such thermochromic behavior arises from one of the following mechanisms phase transition, change in ligand geometry, equilibriums between different molecular structure, or change in the number of solvent molecules in the coordination sphere. Inorganic systems have been predominately employed in heat-indicating paints and crayons that provide a warning of the development of heat spots.

With respect to polymer thermochromism it has been found that polymer thermochromism may arise from polymer planar-nonplanar conformation transition.

Further, with respect to sol-gel thermochromism, it seems that interactions between macromolecules fall into four categories: ionic, hydrophobic, Vanderwaals and hydrogen bonding. Phase transitions in polymer gels provide a means of studying these interactions. Many gels will undergo reversible, discontinuous volumes changes in response to changes in, for example, temperature, gel composition or light irradiation. These transitions result from the competition between repulsive intermolecular forces, usually electrostatic in nature, that act to expand the polymer network, and an attractive force that acts to shrink it. Volume transitions in gels have been observed that are driven by all of the above-mentioned forces except hydrogen bonding. Recently, reversible thermochromism of pH-sensitive dyes embedded in hydrogels was reported The advantages of using hydrogels are biologically degradable, innocuous, free of organic solvent, inexpensive, available in large quantities and non-flammable. Furthermore, the hydrogels allows high transparency.

Thermally controllable reflecting can be obtained in various ways as described above. One of the materials, which can be used for this purpose, are the polymer dispersed liquid crystal (PDLC). PDLC is obtained when liquid crystal molecules are dispersed in an isotropic polymer. Below the isotropic transition temperature of the liquid crystal the system is birefringent and molecules are randomly oriented and thus they induce light scattering. Above the clearing temperature of the liquid crystal the material becomes isotropic and when the refractive index of the isotropic phase matches the refractive index of the polymer above the isotropic transition temperature the system becomes transparent. It is also possible to use liquid crystal with high density of defect points. For example caused by the presence of impurities such as polymer but it can also be particles. Such a system is highly scattering due to the presence of defects which cause domain formation. Upon heating the system above the isotropic transition temperature the system becomes transparent as the anisotropy of the system disappears. In the same way the cholesteric texture without macroscopic orientation can have so-called focal conic texture induced by defect such as particles and polymer in the liquid crystal showing a strong scattering of light. Here again upon heating the system above its isotropic transition the scattering disappears. Cholesteric liquid crystal can also be in a macroscopically orienting state showing reflection colors. Here again upon heating the system the reflection disappears and the system becomes transparent.

Thus, the thermally variable reflecting element may comprise a liquid crystal phase. In an embodiment, the reflecting element is a cholesteric liquid crystal phase. Especially, the thermally variable reflecting element comprises a PDLC.

As mentioned above, the thermally variable reflecting element, such as the polymer dispersed liquid crystal, is arranged downstream of the optional luminescent material layer and downstream of the light source.

The thermally variable reflecting element (in the off-state) may in an embodiment have a white color or may in another embodiment have another color (for instance due to the presence of a dye in the thermally variable reflecting element).

The terms "upstream" and "downstream" relate to an arrangement of items or features relative to the propagation of the light from the light source (here especially a LED), wherein relative to a first position within a beam of light from the light source, a second position in the beam of light closer to the light source is "upstream", and a third position within the beam of light further away from the light source is "downstream".

Preferably, the thermally variable reflecting element changes from the first state to the second state at a temperature selected from the range of about 40-120° C. (transition temperature), more preferably 40-90° C., especially above a temperature of about 55° C., even more especially above about 60° C. As mentioned above, in a preferred embodiment, the thermally variable reflecting element comprises liquid crystals. Which show sharp transition temperatures and almost no hysteresis.

Especially, the light source comprises a light emitting device (LED). Further, the light source may especially be arranged to generate white light.

The luminescent material can be any luminescent material that is able to convert at least part of the light source light or optionally converted light source light into luminescent material light. In general, the luminescent material will be comprised in a layer.

In an embodiment, the light emitting diode (LED) is arranged to emit blue light as LED light and the luminescent material comprises one or more of (a) yellow light emitting luminescent material (able to absorb at least part of the blue LED light) and optionally a red light emitting luminescent material (able to absorb at least part of the blue LED light and/or at least part of the yellow emission) and (b) a green light emitting luminescent material (able to absorb at least part of the blue LED light) and a red light emitting luminescent material (able to absorb at least part of the blue LED light and/or at least part of the green emission). However, also a combination of yellow and green and red emitting luminescent materials might be possible. In this way, white light may be provided.

In yet another embodiment, the light emitting diode (LED) is arranged to emit UV light as LED light and the luminescent material comprises one or more of (a) blue emitting material (able to absorb at least part of the UV LED light) and yellow light emitting luminescent material (able to absorb at least part of the UV LED light and/or at least part of the blue emission) and optionally a red light emitting luminescent material (able to absorb at least part of the UV LED light and/or at least part of the blue emission and/or at least part of the yellow emission) and (b) a blue emitting material (able to absorb at least part of the UV LED light), a green light emitting luminescent material (able to absorb at least part of the UV LED light and/or at least part of the blue emission) and a red light emitting luminescent material (able to absorb at least part of the UV LED light and/or at least part of the blue emission and/or at least part of the green emission). In this way, also white light may be provided.

Although the lighting device may be arranged to provide any type of visible light, in a preferred embodiment, the lighting device is arranged to provide white light (preferably of different types, such as warm or cool white light).

Some luminescent materials, such as the halophosphates, may emit substantially different colors within the visible spectrum. Hence, instead of two or more luminescent materials emitting substantially different colors, also (a) luminescent material(s) that emit two or more colors may be applied. Another example thereof is yttrium aluminum garnet (YAG) (or corresponding garnets) that are doped with cerium and praseodymium.

Although the lighting device may be arranged to provide any type of visible light, in a preferred embodiment, the lighting device is arranged to provide white light (preferably of different types, such as warm or cool white light).

In an embodiment, the lighting device comprises a plurality of light emitting diodes (LEDs) arranged to emit LED emission, such as in the order of 2-100, like 4-64. The term LED may include in an embodiment a plurality of LEDs.

The term white light (such as lighting device light) herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL. The term "predetermined color" may relate to any color within the color triangle, but may especially refer to white light.

The terms "blue light" or "blue emission" especially relates to light having a wavelength in the range of about 410-490 nm. The term "green light" especially relates to light having a wavelength in the range of about 500-570 nm. The term "red light" especially relates to light having a wavelength in the range of about 590-650 nm. The term "yellow light" especially relates to light having a wavelength in the range of about 560-590 nm. The term "light" herein especially relates to visible light, i.e. light having a wavelength selected from the range of about 380-780 nm.

These terms do not exclude that especially the luminescent material may have a broad band emission having emission with wavelength(s) outside the range of for instance about 500-570 nm, about 590-650 nm, and about 560-590 nm, respectively. However, the dominant wavelength of emissions of such luminescent materials (or of the LED, respectively) will be found within the herein given ranges, respectively. Hence, the phrase "with a wavelength in the range of" especially indicates that the emission may have a dominant emission wavelength within the specified range.

Especially preferred luminescent materials may be selected from garnets and nitrides, especially doped with trivalent cerium or divalent europium, respectively. Embodiments of garnets especially include $A_3B_5O_{12}$ garnets, wherein A comprises at least yttrium or lutetium and wherein B comprises at least aluminum. Such garnet may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, assuming $(Y_{1-x}Lu_x)_3Al_5O_{12}$: Ce, part of Y and/or Lu is replaced by Ce. This notation is known to the person skilled in the art. Ce will replace A in general for not more than 10%; in general, the Ce concentration will be in the range of 0.1-4%, especially 0.1-2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

The red luminescent material may in an embodiment comprise one or more materials selected from the group consisting of (Ba, Sr, Ca)S:Eu, (Ba, Sr, Ca)AlSiN$_3$:Eu and (Ba, Sr, Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10, more especially in the range of about 0.5-5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba.

The material (Ba, Sr, Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba, Sr, Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu (i.e. 75% Ba; 25% Sr). Here, Eu is introduced and replaces at least part of M i.e. one or more of Ba, Sr, and Ca).

Likewise, the material (Ba, Sr, Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

The europium containing nitrides or sulphides are also often colored materials, like cerium containing garnet materials.

The term luminescent material herein especially relates to inorganic luminescent materials, which are also sometimes indicated as luminescent materials. These terms are known to the person skilled in the art.

The luminescent material may be comprised in a layer on the wall(s) of the chamber, in and/or on a transmissive ceramic material, in and/or on a transmissive glass, or may be comprised in and/or on a transmissive organic support. The transmissive supports, such as the transmissive ceramic material, the transmissive glass, and the transmissive organic support, may especially be arranged for embodiments, wherein the lighting device is arranged to provide light source light to the exterior via such transmissive support.

The term "layer" may comprise one or more layers. Thus, the term layer may also be interpreted in an embodiment as a plurality of layers. Layers may for instance be arranged adjacent, non-adjacent or on top of each other. A layer may in an embodiment be coated on a part of the chamber, such as a wall and/or the bottom, but such wall or bottom may also be partly coated with such layer.

As mentioned above, the transmissive support may comprise at least part of the luminescent material. The fact that the transmissive support comprises the luminescent material does not exclude that part of the luminescent material may be arranged elsewhere in the lighting device; however, in a specific embodiment, substantially all luminescent material is comprised by the transmissive support. The phrase "the transmissive support comprises the luminescent material" may relate to a transmissive support selected from the group consisting of a transmissive support wherein the luminescent material is embedded in the transmissive support, a transmissive support that is luminescent material itself, a transmissive support having a downstream coating comprising the luminescent material (side directed to the exterior), a transmissive support having an upstream coating comprising the luminescent material (side facing the LED(s)), and a transmissive support comprising both an upstream and downstream coating comprising the luminescent material.

In an embodiment, the transmissive support has an upstream face comprising the coating, wherein the coating comprises at least part of the luminescent material. Such embodiment both benefits from the remote position of the luminescent material (i.e. remote from the LED) and from a relative remote position from the exit window.

In a specific embodiment, at least part of the luminescent material comprises a transmissive ceramic luminescent material, wherein the transmissive support comprises the transmissive ceramic luminescent material. Hence, in this embodiment, the transmissive support is a luminescent ceramic. Especially suitable luminescent ceramics are based on cerium containing garnets, as described above. Transmissive ceramic layers or luminescent ceramics, and their method of preparation, are known in the art. It is for instance referred to U.S. patent application Ser. No. 10/861,172 (US2005/0269582), to U.S. patent application Ser. No. 11/080,801 (US2006/0202105), or to WO2006/097868, to WO2007/080555, to US2007/0126017 and to WO2006/114726. The documents, and especially the information about the preparation of the ceramic layers provided in these documents, are herein incorporated by reference.

In yet another embodiment, the transmissive support comprises an organic material, such as a foil or sheet. Hence, in an embodiment, the luminescent material layer comprises a transmissive organic material support selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), polycarbonate, polyvinylchloride (PVC), polyethyleneterephthalate (PET), (PETG) (glycol modified polyethyleneterephthalate), PDMS (polydimethylsiloxane), and COC (cyclo olefin copolymer).

However, in another embodiment the transmissive support comprises an inorganic material. Preferred inorganic materials are selected from the group consisting of glasses, (fused) quartz, ceramic materials (see above), and silicones.

As mentioned above, the luminescent material may be arranged within and/or on the transmissive support.

The term "transmissive" herein indicates that something is permeable to light, especially to parts of the visible wavelength region, more especially, substantially for the entire visible region (i.e. 380-780 nm). In general, the term transmissive herein indicates that all or part of the visible light is permitted to pass at least partly through (the material), with or without being diffused. Especially, the term "transmissive" may indicate that a 1 cm thick piece (such as a 1*1*1 cm cube) under perpendicular radiation with (visible) light transmits at a predefined wavelength selected from the (visible) light at least about 50%, preferably at least about 80%, even more preferably at least about 90%, yet even more preferably at least about 95% of the light at that predefined wavelength.

Remote luminescent material in LED based light sources seems to be very advantageous with respect to system efficacy, in particular for generation of light with a low color temperature (warm white). Applying a luminescent material coating on a transmissive support (or elsewhere remote from the LED) may result in high system efficacy because only little light may be reflected back into the LED where it has a rather high chance of being absorbed. Using the luminescent material remote from the LEDs can result in efficacy gains up to about 50% compared to systems with luminescent material in the LED package. Hence, the present invention applies a light chamber, with the luminescent material layer(s) remote from the LED. Remote systems, wherein the luminescent material is remote from the light source, are for instance described in WO2007046035 or by Narendran, SPIE 2005, "Improved performance white LED", 5th International Conference on Solid State Lighting, Proceedings of SPIE 5941, 45-50, Bellingham, Wash., International Society of Optical Engineers.

The arrangement of a transmissive support comprising the luminescent material instead of arranging the luminescent material to the LED allows a non-zero distance between the luminescent material and the LED. This distance is especially a shortest distance. This means that in an embodiment, any shortest distance between the LED and the luminescent material is equal to or especially larger than 0 mm. In an embodiment the luminescent material LED distance is in the range of 0.5-50 mm, especially in the range of 3-20 mm.

The lighting device may comprise more than one transmissive supports, with one or more of such transmissive supports comprising luminescent material. The more than one transmissive supports may for instance comprise different luminescent materials.

As mentioned above, the luminescent material (layer) may in embodiments or may in other embodiments not be comprised by part of the wall(s) of the light chamber. Those parts of the wall(s) (including bottom) not comprising the luminescent material are preferably reflective, and may for instance comprise a reflective coating. For instance MCPET (microcellular polyethylene terephthalate) may be applied as reflective material. In this way, good mixing of the LED light and the luminescent material emission may be obtained.

Heat may be transferred to the thermally variable reflecting element from different sources and via different routes. For instance, heat from the light source may be transferred directly or indirectly to the thermally variable reflecting element. However, alternatively or additionally, heat from the optional luminescent material may be transferred directly or indirectly to the thermally variable reflecting element. Direct transfer of heat may especially be obtained by physical contact between the light source and/or the luminescent material and the thermally variable reflecting element; indirect heat transfer may especially be obtained by transport of heat from the light source and/or the luminescent material a heat transferring material to the thermally variable reflecting element. Especially, a heat sink may be applied, in physical contact with the light source and/or the luminescent material and in physical contact with the thermally variable reflecting element. The heat transferring material preferably has a thermal conductivity of at least about 40 W/(mK), preferably at least about 250 W/(mK), such as in the range of about 100-1500 W/(mK). Hence, in this way the lighting device is arranged to transport heat generated by one or more of the light source and the optional luminescent material to the thermally variable reflecting element. Any material having a thermal conductivity of at least about 100 W/(mK) can be used as heat sink. Examples of such materials are for instance copper or aluminum.

Hence, in an embodiment the lighting device further comprises a heat sink wherein the thermally variable reflecting element is in physical contact with the heat sink. In a further embodiment, the thermally variable reflecting element is in physical contact with the light source. In yet a further embodiment, the thermally variable reflecting element is in physical contact with luminescent material.

Therefore, the invention advantageously provides in a further aspect the use of a thermally variable reflecting element in a lighting device comprising (a) light source arranged to generate light source light, (b) an optional luminescent material arranged downstream of the light source and arranged to convert at least part of the light source light into luminescent material light, wherein one or more of the light source and the optional luminescent material generate heat when the light source generates light source light, and (c) the thermally variable reflecting element, arranged downstream of the light source and the optional luminescent material, having a first state wherein it is substantially reflecting and a second state wherein it is substantially transparent, and wherein heat induces a chance from the first state to the second state, wherein the thermally variable reflecting element is arranged to transmit at least part of one or more selected from the group consisting of the light source light and optional luminescent material light when being in the second state, and wherein the lighting device is arranged to transport heat generated by one or more of the light source and the optional luminescent material to the thermally variable reflecting element, to impede visibility of one or more of the light source and the optional luminescent material from the exterior when the light source is switched off.

The invention advantageously allows to "mask" the presence of a light source, such as a LED, or the presence of (colored) luminescent material, either on the light source, or on or in a dome on the light source, or remote from the light source in a layer, in a lighting device, when such light source is switched off, and may allow nearly instantaneously after switching on the light source substantial transmission of the light source light and/or the luminescent material light of the optional luminescent material.

Optionally, the thermally variable reflecting element may further have optical properties selected from the group consisting of focusing or defocusing properties. Further, the thermally variable reflecting element may be arranged to allow in an intermediate state transmission of the light source light and/or the luminescent material light but still scatter at least part of this light.

According to yet a further aspect, the invention provides a lighting device comprising (a) a light source arranged to generate light source light, (b) an optional luminescent material arranged downstream of the light source and arranged to convert at least part of the light source light into luminescent material light, and (c) a thermally variable reflecting element, arranged downstream of the light source and the optional luminescent material, having a first state wherein it is substantially reflecting and a second state wherein it is substantially transparent, and wherein heat induces a chance from the first state to the second state, and wherein the thermally variable reflecting element is arranged to transmit at least part of one or more selected from the group consisting of the light source light and optional luminescent material light when being in the second state, and (d) a controller electrically connected with a heating element, wherein the heating element is arranged to be able to heat the thermally variable reflecting element, wherein the controller is arranged to control the thermally variable reflecting element. Such controller may be arranged to provide electric power to such heating element, to control the change of the first to the second state (and optionally vice versa).

Further, according to yet another aspect, the invention provides a lighting device comprising (a) a light source arranged to generate light source light, (b) an optional luminescent material arranged downstream of the light source and arranged to convert at least part of the light source light into luminescent material light, and (c) a thermally variable reflecting element, arranged downstream of the light source and the optional luminescent material, having a first state wherein it is substantially reflecting and a second state wherein it is substantially transparent, and wherein heat induces a chance from the first state to the second state, and wherein the thermally variable reflecting element is arranged to transmit at least part of one or more selected from the group consisting of the light source light and optional luminescent material light when being in the second state, wherein the lighting device is arranged simultaneously provide current to the light source and the thermally variable reflecting element when the light source is switched on. In this way, when LED is to be turned on current is also supplied to the resistive layer to heat it. As a result the thermo responsive element may become substantially transparent).

In an embodiment, the lighting device may further comprise a sensor arranged to sense one or more optical properties from the lighting device light and arranged to provide a corresponding sensor signal, wherein the controller is further arranged to control the thermally variable reflecting element in response to the sensor signal. In this way, the controller may be used to tune the device light of the lighting device to the desired device light intensity and optionally reflection angle, in response to the sensor signal.

In a further embodiment, the lighting device may comprise a plurality of thermally variable reflecting elements.

As mentioned above, the thermally variable reflecting element preferably comprises a substantially non-transmissive state, and the thermally variable reflecting element may therefore especially be used to impede visibility of one or more of the optional (colored) luminescent material layer and the light source, especially a LED, from the exterior, when the light source is switched off.

In another embodiment a specular reflecting thermally variable reflecting element is placed above the luminescent material (i.e. arranged downstream of the luminescent material). The element has the characteristic of reflecting white light (such as solar light) in the off state. When the temperature is increased the reflection disappears and the material becomes transparent. In order to reduce angular dependence of such an element a light diffusing element with low back reflection can be used. This element can also show thermally variable effect.

In yet another embodiment it is possible to combine certain wavelength reflecting materials with luminescent materials which absorb in a certain wavelength region to make the appearance of the system color neutral. For example a yellow luminescent material absorbs blue light. When on top of such a yellow phosphor a blue reflecting thermally variable reflecting element is placed its appearance will become color neutral and it will reflect white light. In order to reduce angular dependence of such an element a light diffusing element with low back reflection can be used. This element can also show thermally variable effect.

In another embodiment it is possible to use photonic crystals which can be thermally tuned. For instance, polymer beads in a polymer matrix which show thermally variable reflecting characteristics can be used. Another example are photonic crystals embedded in (for instance) a liquid crystal which changes from a first reflecting state to a second transmissive state upon increasing temperature. These photonic crystals (structures) may be produced by imprint lithography or other lithography techniques.

Such a reflecting layer comprising LED can be used in also other applications other than mobile telephone flash units. Other applications are but not limited to Flash lights(torches), automobile head lamps, retrofit lamps, luminaries, digital video cameras, bicycle lamps, head lamps, etc.

BRIEF DESCRIPTION OF THE DRAWINGS

Embodiments of the invention will now be described, by way of example only, with reference to the accompanying schematic drawings in which corresponding reference symbols indicate corresponding parts, and in which.

DESCRIPTION OF PREFERRED EMBODIMENTS

FIGS. 1a-1f schematically depict a non-limiting number of embodiments of the lighting device, indicated with reference 100, according to the invention. The light sources are indicated with reference number 10.

By way of example, LEDs are displayed as light source 10. Here below, the light source 10 is further indicated as LED 10. However, this is to be interpreted as light source in general, unless indicated otherwise or unless clear for a person skilled in the art from the description (of the embodiments) that only a LED is meant. The light source may also be an OLED or a laser.

By way of example, 1 LEDs 10 are depicted, but a plurality of LEDs, such as 2, 4 or 10, 16 or 100, etc. may be applied.

These schematical Figures further show a support 20, whereon the light source 10 is arranged. This support 20 may in an embodiment be a substrate, such as an IC, but may in an embodiment also be a heat sink. Heat sinks are known in the art, and may especially refer to an object that absorbs and dissipates heat from another object using thermal contact (either direct or radiant). Preferably, the heat sink is in physical contact with the light source 10.

Figure 1A:
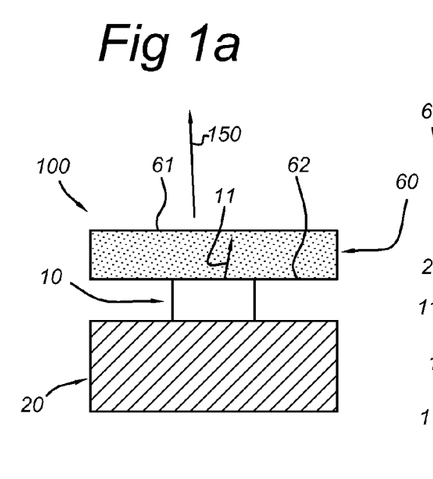
FIGS. 1a-1f schematically depict a non-limiting number of embodiments of the lighting device according to the invention.
Figure 1B:
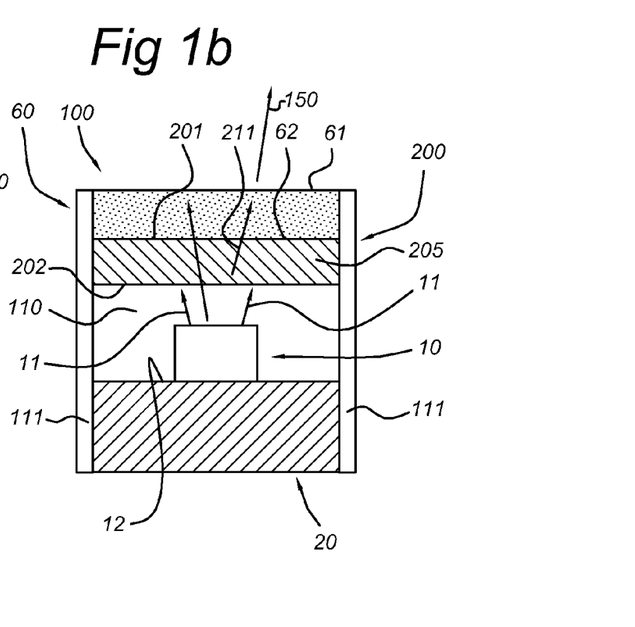
Figure 1C:
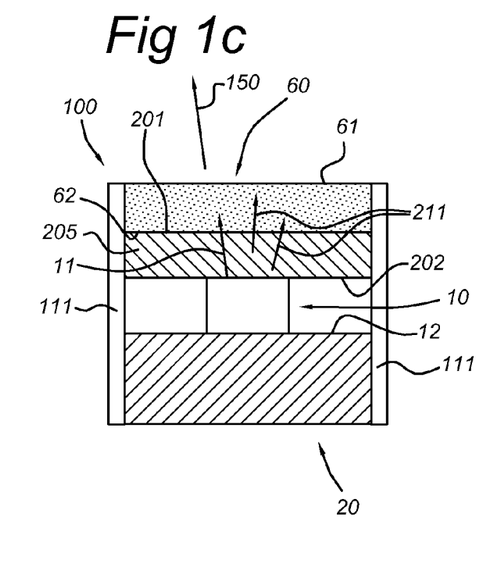
Figure 1D:
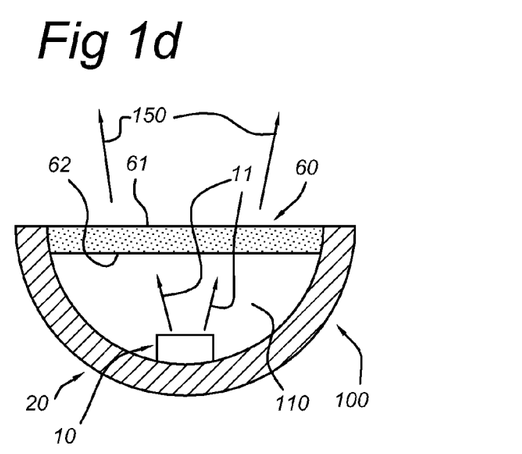
Figure 1E:
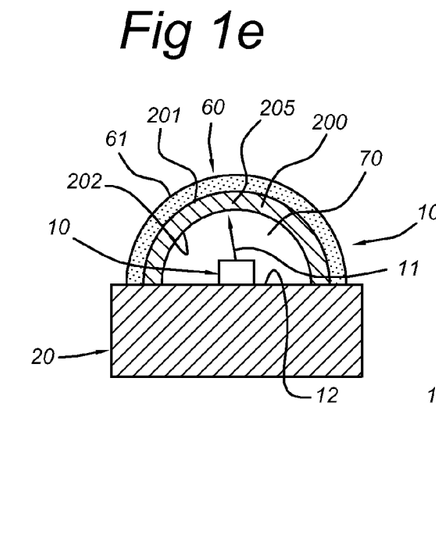
Figure 1F:
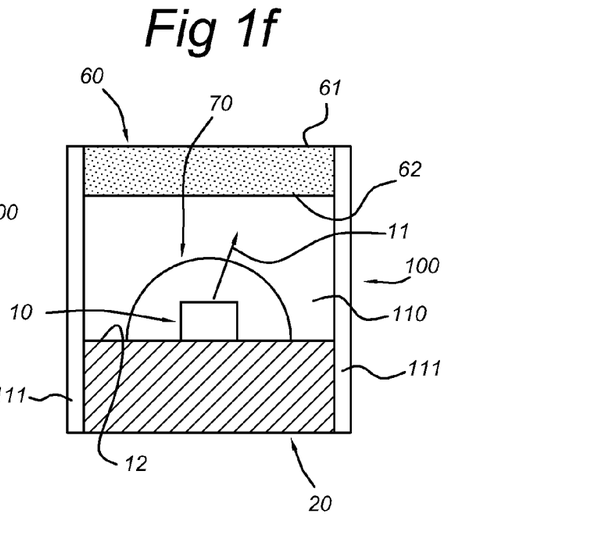
Figure 2A:
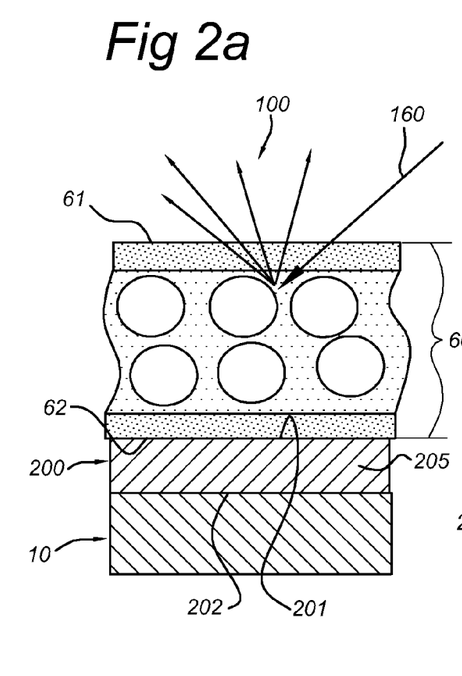
FIGS. 2a-2b schematically depict in more detail an embodiment of the lighting device according to the invention in an "off" an "on" state.
Figure 2B:
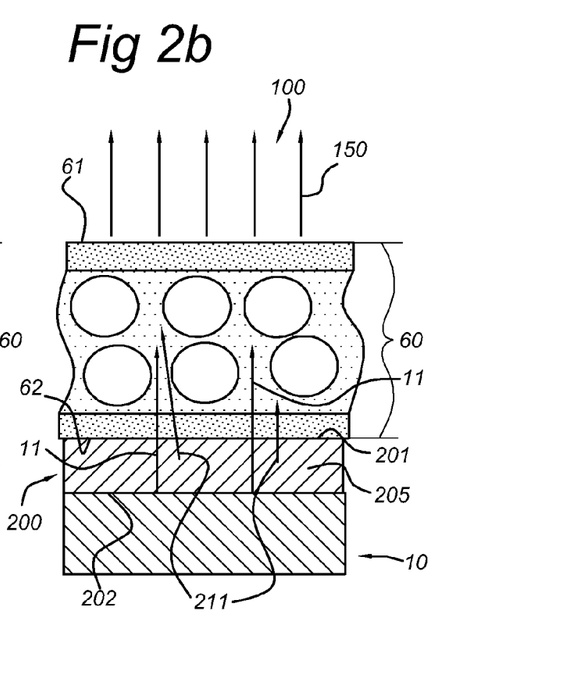

The embodiments of the lighting device 100, as depicted in those Figures, at least comprise the light source 10, which is arranged to generate light source light, indicate with reference 11 (for the sake of simplicity, this light is not drawn in all these schematic drawings; see however also FIGS. 2a-2b) and a thermally variable reflecting element 60, arranged downstream of the light source 10. The thermally variable reflecting element 60 has a first state wherein it is substantially reflecting and a second state wherein it is substantially transparent (see also FIGS. 2a-2b below). The thermally variable reflecting element 60 is an element wherein heat induces a chance from the first state to the second state. The thermally variable reflecting element 60 is arranged to transmit the light source light 11 when being in the second state.

The thermally variable reflecting element 60 has an upstream face 62 and a downstream face 61; the former being directed to the light source 10 and the latter being directed to the exterior of the lighting device 100. The lighting device 100 is arranged to transport this heat generated by the light source 10 to the thermally variable reflecting element 60. Embodiments thereof are further illustrated in FIGS. 1b-1f.

Optionally (see also FIGS. 1b, 1c and 1e), the thermally variable reflecting element 60 further comprises an optional luminescent material 205. This luminescent material 205 is arranged downstream of the light source 10 and is further arranged to convert at least part of the light source light 11 into luminescent material light 211 (for the sake of simplicity, this light is not drawn in all these schematic drawings; see however also FIGS. 2a-2b).

The light source 10 and/or the luminescent material 205 generate heat when the light source 10 generates light source light 11. In this embodiment, the thermally variable reflecting element 60 is arranged downstream of the light source 10 and the luminescent material 205 and the thermally variable reflecting element 60 is arranged to transmit at least part of the light source light 11 and the luminescent material light 211 when being in the second state.

The heat generated in the luminescent material 205 is due to non-radiative relaxation via phonons, such as due to a Stokes-shift between excitation and emission. The lighting device 100 is arranged to transport this heat generated by the light source 10 and/or the optional luminescent material 205 to the thermally variable reflecting element 60.

Note that the light source 10 in FIGS. 1a-1f may comprise for instance an LED with a luminescent material coating, as commercially known, but may also in an embodiment refer to a bare light source, especially a LED, of which the light source light 11 might optionally be converted downstream of the light source 10 (at a non-zero distance thereof).

The luminescent material 205 may thus be arranged in a layer, such as a coating, or a plurality of coatings, on the LED. However, the luminescent material 205 may also be arranged on walls of a light chamber (see also below). Further, the luminescent material 205 may also be comprised in or on a transmissive material, such as a transmissive support or a luminescent ceramic material.

The thermally variable reflecting element 60 is arranged downstream of the optional luminescent material 205, or of such luminescent material layer 200. Further, the thermally variable reflecting element 60 is arranged downstream the light source 10. This means that when the thermally variable reflecting element 60 would be in a complete reflecting state, substantially no luminescent material light 211 of optional luminescent material 205 and no light source 10 might be visible from the exterior.

Here, the thermally variable reflecting element 60 is drawn as an optical element that has to be passed by the light source light 11 (if any) and the luminescent material light 220 (if any) to escape to the exterior of the lighting device 100. Hence, the thermally variable reflecting element 60 is arranged to prevent light source light 11 (if any) and the luminescent material light 220 (if any) escape to the exterior of the lighting device, if the thermally variable reflecting element 60 would be in the substantially reflecting state (first state). However, due to heating of the thermally variable reflecting element 60, this element "opens" after switching on the light source 10, and thereby allowing light source light 11 and/or luminescent material light 211 escape to the exterior. Note that in case of UV light sources are applied, substantially all light source light 11 may be absorbed by the luminescent material 205 (and at least partially converted into luminescent material light 211).

FIG. 1b schematically depicts an embodiment comprising a luminescent material layer 200, such as a luminescent material 205 coated on a thin foil or comprised in a luminescent ceramic, arranged downstream of the thermally variable reflecting element 60. Further, a wall 111 surrounds the light source 10. The support 20, the wall 111 and the luminescent material layer 200 provide a light chamber 110. This may be used for mixing light 11 of the light source 10 and luminescent material light 211 of the luminescent material 205. The walls 111 and bottom 12 are preferably provided with a reflective material, such as a reflective coating comprising MCPET. The walls and chamber are optional. Here, the luminescent material 205 is arranged remote from the light source 10 (i.e. at a non-zero distance).

The walls 111 may for instance be in physical contact with the support, and the walls 111, may also be in physical contact with the thermally variable reflecting element 60. In this way, heat of the light source 10 may be transferred to the thermally variable reflecting element 60.

Here, the luminescent material layer 200 is adjacent and substantially in contact with the thermally variable reflecting element 60, such as a PDLC, but other configurations are also possible. Hence, in this Figure, the luminescent material 205 is in physical contact with the thermally variable reflecting element 60. In this way, heat generated in the luminescent material 205, may also be transferred to the thermally variable reflecting element 60. The heat transferring materials (here the support material and/or the wall material) preferably have a thermal conductivity of at least about 100 W/(mK).

Note that more than one type of luminescent material may be present and/or luminescent material may be present at different positions within the lighting device 100.

In FIG. 1b, the distance light source 10—luminescent material 205 (as present in luminescent material layer 200) is non-zero. However, in FIG. 1c, the light source 10 and luminescent material 205, or more precisely the luminescent material layer 200, are in physical contact. In this way, heat generated in the luminescent material 205 may be transferred to the thermally variable reflecting element 60. Advantageously, in this way heat may dissipate from the luminescent material 205.

FIG. 1d schematically depicts another embodiment of arranging thermally variable reflecting element 60 over the LED 10 without bringing them into contact. One can for example use the heat from the heat sink of the LED to heat the thermo responsive element as shown in FIG. 1c, wherein the heat sink is curved. Here, the wall 111 is used as heat sink, and is curved, for instance as a reflector; the reflector opening comprises the thermally variable reflecting element 60. In such a configuration the thermally variable reflecting element 60 can optionally be combined with an optical element such as a lens. In yet a further embodiment, the thermally variable reflecting element 60 itself is also arranged as optical element, for instance for focusing, defocusing or collimation of device light.

FIG. 1e schematically shows an embodiment wherein the light source 10 comprises a dome 70 surrounding the light source 10. Especially LEDs may comprise such dome 70. In the embodiment schematically depicted in FIG. 1e, the dome 70 further comprises external layers: the luminescent material layer 200 and downstream thereof the thermally variable reflecting element 60. Heat from the light source 10 may travel via support 20, especially via a heat sink as support 20, to the thermally variable reflecting element 60. Alternatively or additionally, heat from the luminescent material 205 may travel to the thermally variable reflecting element 60, especially since in this embodiment the luminescent material 205 is in physical contact with the thermally variable reflecting element 60.

FIG. 1f schematically depicts an LED comprising such dome 70, where optionally luminescent material 205 (not depicted) may be arranged on the light emitting surface of the LED and/or (be dispersed) in the dome 70 and/or may be arranged at wall 111, but may in an embodiment also be absent. The LED comprising dome 70 is enclosed in the light chamber 110. Heat of the light source 10 may again be transferred from the support 20, preferably being a heat sink, to the wall 111, also preferably being a heat sink, to the thermally variable reflecting element 60. Here, the wall 111 and support being heat sinks especially indicate that those items have a thermal conductivity of at least about 40 W/(mK).

FIGS. 2a-2b schematically depicts how the lighting device 100 according to the invention may function. As example of thermally variable reflecting element 60 PDLC material is applied. At low temperatures the liquid crystal of the PDLC is anisotropic and thus shows light reflecting (of external light 160, such as day light) as there is a mismatch in the refractive indices of the polymer and the liquid crystal of the PDLC. Upon switching the LED as light source 10 on, the temperature increases to above the isotropic transition temperature (such as about 60° C.) of the liquid crystal. In the isotropic state liquid crystal material has a single refractive index which matches that of the polymer and thus the system becomes transparent. Light source light 11 and luminescent material light 211 (induced by absorbing part of the light source light 11 and emitting luminescence) now travels substantially unhindered through the thermally variable reflecting element 60, thereby providing device light 150. This device light 150 may consist, depending upon the presence of luminescent material 205, of light source light 11 (absence of luminescent material 205 or absorption by the luminescent material 205), of light source light 11 and luminescent material light 211 (conversion of part of the light source light 11 into luminescent material light 211), or luminescent material light 211 (total absorption of the light source light by the luminescent material and conversion of at least part of the light source light 11 into luminescent material light 211, or the same, but further blocking, for instance by an optical filter, of the light source light 11).

Figure 3A:
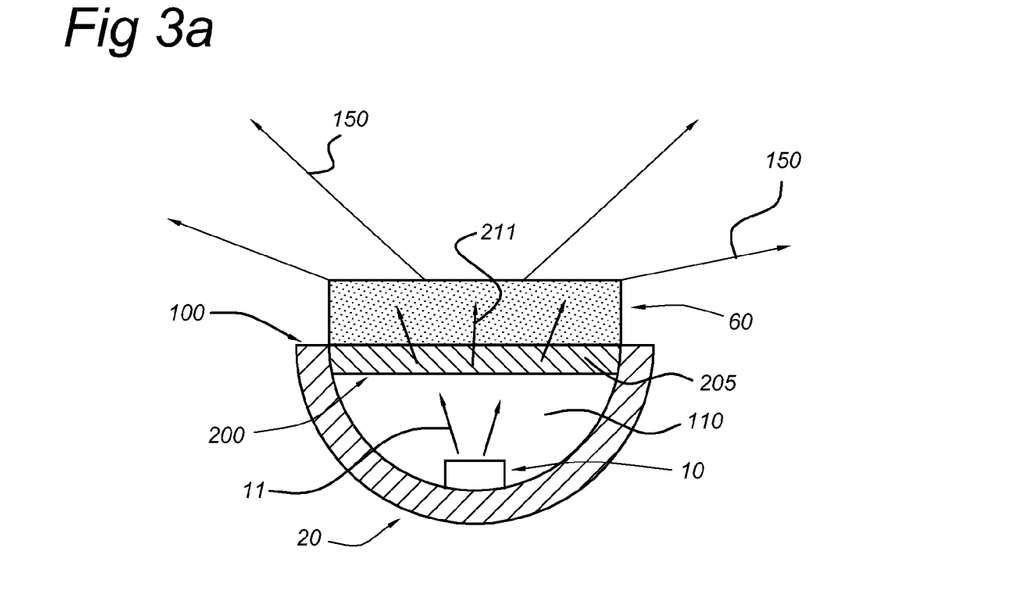
FIGS. 3a-3b schematically depict another embodiment of the lighting device according to the invention.
Figure 3B:
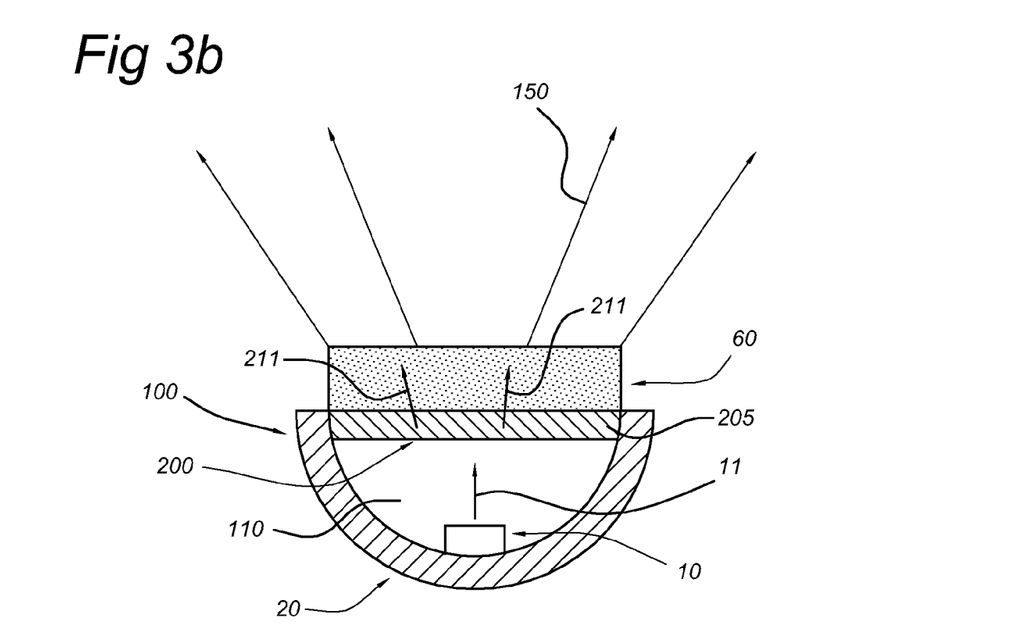

FIGS. 3a-3b schematically depict that in addition to the reflecting effect such thermally variable reflecting element 60 can also be designed to have an optical effect for beam control of the device light 150. For example the thermally variable reflecting element 60 can be chosen so that when the LED 10 is used in a flash mode the temperature is not high enough so that the layer remains partly reflecting (intermediate state) and thus the beam angle is rather broad (FIG. 3a). When the flash is used in a torch mode then the thermally variable reflecting element 60 becomes transparent and for example a beam with a higher collimation is obtained (FIG. 3b).

It might also be desirable to have a colored appearance from the temperature responsive element. Hence, in yet another embodiment, small amount of dye molecules can be added to the thermally variable reflecting element 60. Such a dye containing thermally variable reflecting element 60 in the reflecting state may show strong colored appearance due to an increased path length as a result of reflecting while in the transparent state it show only a slight absorption and thus remains highly transparent. Such embodiment may for instance be used when one desires to match the color of the (exit window of the) lighting device 10 with the device wherein such lighting device 10 may be incorporated.

Figure 4:
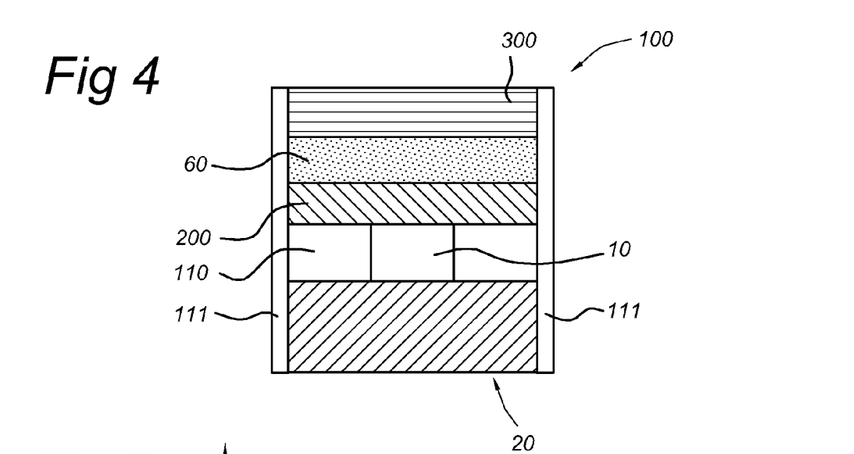
FIG. 4 schematically depict another embodiment of the lighting device according to the invention showing a reflecting layer.

FIG. 4 schematically shows an embodiment of the lighting device 100 with a the thermally variable reflecting element 60, with downstream thereof an optional diffuser 300. Optionally, this optional diffuser 300 is also thermally variable, preferably in the same way as the thermally variable scattering element 60. Upstream of the thermally variable scattering element 60, luminescent material 200 is arranged.

Figure 5A:
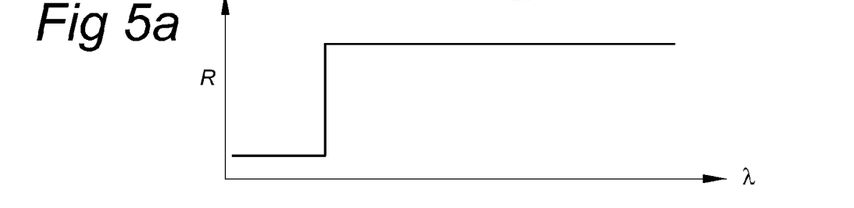
FIGS. 5a-5d schematically depict the properties of an embodiment of the lighting device.
Figure 5B:
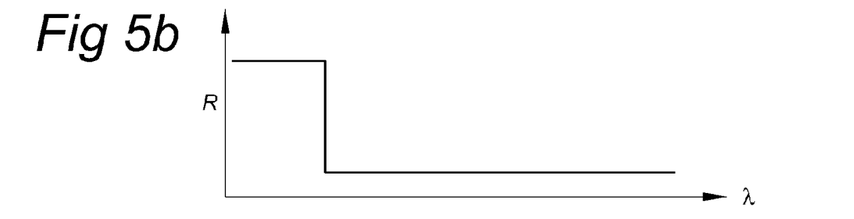

Referring to FIGS. 5a-5d, the luminescent material 200 may by way of example have a reflection (R) as schematically depicted in FIG. 5a. The reflection of the thermally variable scattering element 60 may be tuned to reflect in (at least) another part of the (visible) wavelength region than the luminescent material 200. This is schematically depicted in FIG.

Figure 5C:
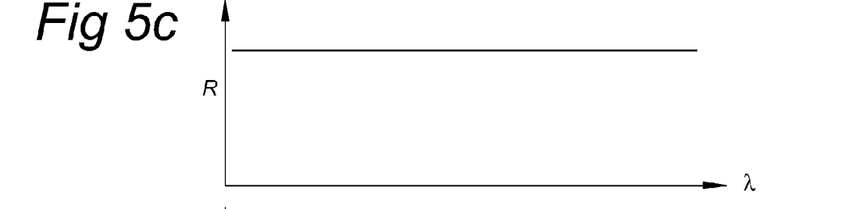
Figure 5D:
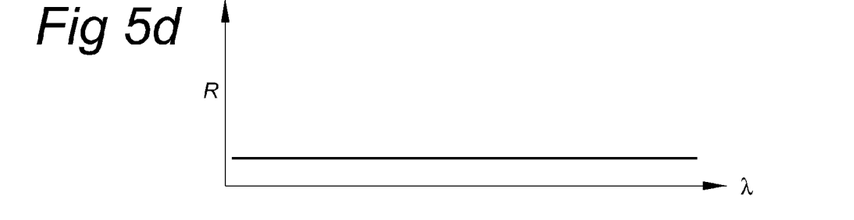

5b. A resulting reflection is schematically depicted in FIG. 5c. The reflection FIGS. 5b and 5c relate to the low temperature situation (i.e. first state). However, when switching the device on, the thermally variable scattering element decreases reflection, the luminescent material 200 may emit light, and the reflection of the thermally variable scattering element 60 is schematically depicted in FIG. 5d: substantially no reflection; wherein in the first state (FIG. 5c), substantially all light is reflected.

Further, the lighting device 1 may comprise (an internal or external) controller (not depicted) which is electrically connected to the thermally variable reflecting element 60. This controller is arranged to control the reflecting of the thermally variable reflecting element 60. The controller may also be electrically connected to a sensor, arranged to measure one or more optical properties, such as intensity or beam angle of the device light 150, and arranged to generate a corresponding sensor signal, and/or electrically connected to the LED(s) 10. With the latter option, also the intensity of the LED 10 may be controlled by controller.

The lighting device 1 may further comprise a user interface (not depicted). The user interface may electrically be connected to the controller. The user interface or user input device ("local" or "remote") controls the lighting generated by the lighting device 100 as selected by the user. The interface or input device may comprise control action buttons shown in an intuitive way, how the end user can navigate along the available settings. An intelligent microprocessor may allow a user to generate dynamic light effects via an algorithm. The user interface may comprise a remote control unit.

In a specific embodiment, instead of or in addition to the LED as light source 10, conventional light sources such as (small) GLS lamps may be applied. Further, also combinations of blue and UV LEDs and accompanying luminescent material may be applied.

Example

A Rebel LED with thermally variable reflecting element 60 was made, in physical contact with the LED. The thermally variable reflecting element 60 was obtained by mixing Norland 65 resin mixed together with liquid crystal E7 (Merck). After polymerization of the polymerization reflecting so-called polymer dispersed liquid crystal where the liquid crystal molecules are dispersed in a polymer matrix is obtained (PDLC). In the LED off state the temperature responsive reflecting element is reflecting and has a white appearance. When the LED is switched on it becomes spontaneously transparent and light emitted by the LED pass through the temperature responsive element. When the LED is switched off the element becomes reflecting and has again the white appearance.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A lighting device comprising:
a light source arranged to generate light source light;
a luminescent material arranged downstream of the light source and arranged to convert at least part of the light source light into luminescent material light, wherein one or more of the light source and the luminescent material generate heat when the light source generates light source light; and
a thermally variable reflecting element, arranged downstream of the light source and the luminescent material, having a first state wherein it is substantially reflecting and a second state wherein it is substantially transparent, and wherein heat induces a chance from the first state to the second state, wherein the thermally variable reflecting element is arranged to transmit at least part of the light source light and/or luminescent material light when being in the second state, and
wherein the lighting device is arranged to transport heat generated by one or more of the light source and the luminescent material to the thermally variable reflecting element.

2. The lighting device according to claim 1, wherein the light source comprises a light emitting device.

3. The lighting device according to claim 1, wherein the light source is arranged to generate white light.

4. The lighting device according to claim 1, wherein the thermally variable reflecting element is in physical contact with the light source.

5. The lighting device according to claim 1 further comprising a heat sink, wherein the thermal variable reflecting element is in physical contact with the heat sink.

6. The lighting device according to claim 1, wherein the luminescent material is comprised in a luminescent material layer.

7. The lighting device according to claim 6, wherein the luminescent material layer comprises a transmissive ceramic layer.

8. The lighting device according to claim 1, wherein the thermally variable reflecting element is arranged to be diffuse reflecting in the first state.

9. The lighting device according to claim 1, wherein the thermally variable reflecting element is arranged to be specularly reflecting in the first state.

10. The lighting device according to claim 1, wherein the thermally variable reflecting element is in physical contact with luminescent material.

11. The lighting device according to claim 1, wherein the thermally variable reflecting element comprises a liquid crystal phase.

12. The lighting device according to claim 1, wherein the reflecting element is a cholesteric liquid crystal phase.

13. The lighting device according to claim 1, wherein the thermally variable reflecting element changes from the first state to the second state at a temperature selected from the range of 40-90° C.

* * * * *